United States Patent [19]
Lee et al.

[11] Patent Number: 6,165,839
[45] Date of Patent: Dec. 26, 2000

[54] PROCESS TO FABRICATE A CYLINDRICAL, CAPACITOR STRUCTURE UNDER A BIT LINE STRUCTURE FOR A DYNAMIC RANDOM ACCESS MEMORY CELL

[75] Inventors: Yu-Hua Lee, Hsinchu; Cheng-Ming Wu, Kao-Hsiung; Wen-Chuan Chiang, Hsin-Chu, all of Taiwan

[73] Assignee: Taiwan Semiconductor Manufacturing Company, Hsin-Chu, Taiwan

[21] Appl. No.: 09/092,880

[22] Filed: Jun. 8, 1998

[51] Int. Cl.[7] .................................................. H01L 21/8242
[52] U.S. Cl. .......................... 438/253; 438/396; 438/397; 438/254
[58] Field of Search .................................... 438/253, 254, 438/255, 396, 397, 398

[56] References Cited

U.S. PATENT DOCUMENTS

| | | | |
|---|---|---|---|
| 5,206,183 | 4/1993 | Dennison | 437/47 |
| 5,292,677 | 3/1994 | Dennison | 438/396 |
| 5,338,700 | 8/1994 | Dennison et al. | 437/60 |
| 5,401,681 | 3/1995 | Dennison | 437/60 |
| 5,498,562 | 3/1996 | Dennison et al. | 438/253 |
| 5,500,384 | 3/1996 | Melzner | 438/396 |
| 5,563,089 | 10/1996 | Jost et al. | 438/398 |
| 5,605,857 | 2/1997 | Jost et al. | 437/60 |
| 5,648,291 | 7/1997 | Sung | 437/52 |
| 5,668,038 | 9/1997 | Huang et al. | 438/396 |
| 5,770,498 | 6/1998 | Becker | 438/239 |
| 5,776,815 | 7/1998 | Pan et al. | 438/396 |
| 5,792,688 | 8/1998 | Tseng | 438/253 |
| 5,866,453 | 2/1999 | Prall et al. | 438/253 |
| 5,955,758 | 9/1999 | Sandhu et al. | 257/306 |
| 6,008,085 | 12/1999 | Sung et al. | 438/253 |

*Primary Examiner*—Carl Whitehead, Jr.
*Assistant Examiner*—Toniae M. Thomas
*Attorney, Agent, or Firm*—George O. Saile; Stephen B. Ackerman

[57] ABSTRACT

A process for forming a DRAM, cylindrical shaped, stacked capacitor structure, located under a bit line structure, has been developed. The process features defining a polysilicon cell plate structure, during the same photolithotgraphic and anisotropic etching procedures, used to open a bit line contact hole. The bit line contact hole is formed by first opening a top portion of the bit line contact hole, using a photoresist shape as an etch mask, and after the formation of silicon nitride spacers, on the sides of the top portion of the bit line contact hole, the bottom portion of the bit line contact hole is opened, using silicon nitride as an etch mask.

13 Claims, 8 Drawing Sheets

PROCESS TO FABRICATE A CYLINDRICAL, CAPACITOR STRUCTURE UNDER A BIT LINE STRUCTURE FOR A DYNAMIC RANDOM ACCESS MEMORY CELL

BACKGROUND OF THE INVENTION (1) Field of the Invention

The present invention relates to fabrication processes used to create a dynamic random access memory, (DRAM), device, on a semiconductor substrate (2) Description of Prior Art Cylindrical shaped, capacitor structures, have been used to increase the surface area of DRAM capacitors, and thus increase the signal or performance of DRAM devices. Stacked capacitor structures, (STC), located overlying the transfer gate transistor, of the DRAM device, are limited by the dimensions of the underlying transfer gate transistor. Therefore to increase the surface area of the STC structure, without infringing on neighboring, underlying transfer gate transistors, specific STC shapes are employed. For example, a cylindrical shaped, storage node structure, comprised of vertical polysilicon features, connected to an underlying horizontal polysilicon feature, offers increased storage node surface area, when compared to counterparts, fabricated without vertical polysilicon features, or without the use of the cylindrical shape. The use of the cylindrical shaped, STC structure, however results in a difficulties when patterning the cell plate, or upper plate, of the STC structure. The cylindrical shape, established for the lower plate, or storage node structure, of the STC structure, presents a difficult topography when attempting to define the polysilicon upper plate, via photoresist and dry etching procedures.

This invention will offer a novel method for definition of the polysilicon cell plate, or lower plate, wherein the definition of this plate is accomplished during the same procedure used to create a bit line contact hole. This invention will describe the attainment of a Capacitor Under Bit line, (CUB), structure, where the STC structure exhibits a cylindrical shape, and where the bit line contact hole opening procedure, also defines the final STC configuration. Prior art, such as Jost et al, in U.S. Pat No. 5,605,857, Sung, in U.S. Pat. No. 5,648,291, and Dennison, in U.S. Pat. No. 5,206,183, all describe the formation of bit line contact holes, however none of these prior arts describe a process for defining the STC structure, during the bit line contact hole opening.

SUMMARY OF THE INVENTION

It is an object of this invention to create a cylindrical shaped, storage node structure, for a DRAM, stacked capacitor structure.

It is another object of this invention to create a capacitor under bit line, (CUB), STC structure, for a DRAM device.

It is still another object of this invention to define the cell plate shape, of the DRAM STC structure, during the opening of the bit line contact hole.

It is still yet another object of this invention to form silicon nitride spacers, on the sides of a top portion of the bit line contact hole, prior to creating the bottom portion of the bit line contact hole.

In accordance with the present invention a process for forming a cylindrical shaped, stacked capacitor structure, for a DRAM device, in which the definition of the cell plate, of the STC structure, is performed during the opening of the bit line contact hole. Transfer gate transistors, used for the DRAM device, are provided. Storage node contact holes are opened in a composite insulator layer, comprised of an underlying interlevel polyoxide, (IPO), layer, and an overlying, first: silicon nitride layer, exposing the top surface of source/drain regions, of the transfer gate transistors. Polysilicon plugs are next formed in the storage node contact holes. Cylindrical shaped, polysilicon storage node capacitor shapes are formed, each overlying the first silicon nitride layer, and each contacting an underlying polysilicon plug. A capacitor dielectric layer is formed on each cylindrical shaped, polysilicon storage node shape, followed by the deposition of a polysilicon layer, overlying the capacitor dielectric layer, on the cylindrical shaped, polysilicon storage node shape, and overlying the first silicon nitride layer, located between cylindrical shaped, polysilicon storage node shapes. An interlevel dielectric layer, (ILD), is next deposited, followed by the deposition of a second silicon nitride layer. Photolithographic and anisotropic reactive ion etching, (RIE), procedures, are then used to open a top portion of a bit line contact hole, in a region between the cylindrical shaped, polysilicon storage node shapes, with the top portion of the bit line contact hole being formed in the second silicon nitride layer, in the ILD layer, in the polysilicon layer, and in the first silicon nitride layer. This photolithographic and anisotropic RIE procedure also results in the definition of a polysilicon cell plate structure, thus consequently resulting in the creation cylindrical shaped, STC structures, overlying, and contacting polysilicon plugs, which in turn contacts a source/drain region, of an underlying transfer gate transistor. Silicon nitride spacers are next formed on the sides of the top portion of the bit line contact hole, followed by the opening of the bottom portion of bit line contact hole, in the IPO layer, via a selective anisotropic RIE procedure, using the second silicon nitride layer as a mask. The final bit line contact hole, comprised of a top portion, lined with silicon nitride spacers, and a bottom portion, exposes the top surface of a source/drain region, located between transfer gate transistors. Metal deposition, followed by patterning procedures, are used to create the bit line structure, located on the surface of the second silicon nitride layer, and located in the bit line contact hole.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The process for forming a DRAM, capacitor under bit line, (CUB), structure, featuring a cylindrical shaped, stacked capacitor, (STC), structure, and defining the polysilicon cell plate component, of the cylindrical shaped, STC structure, during the process sequence used to open the bit line contact hole, will now be described in detail.

Figure 1:
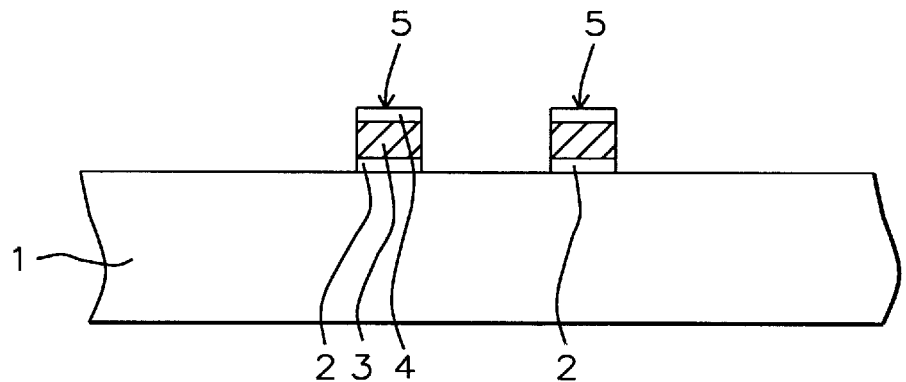
FIGS. 1–5, 6B, 7, 8B, 9–13, 14B, and 15, which schematically, in cross-sectional style, show the creation of a cylindrical shaped, DRAM STC structure, in which the polysilicon cell plate, of the STC structure, is defined during the opening of a bit line contact hole.
Figure 2:
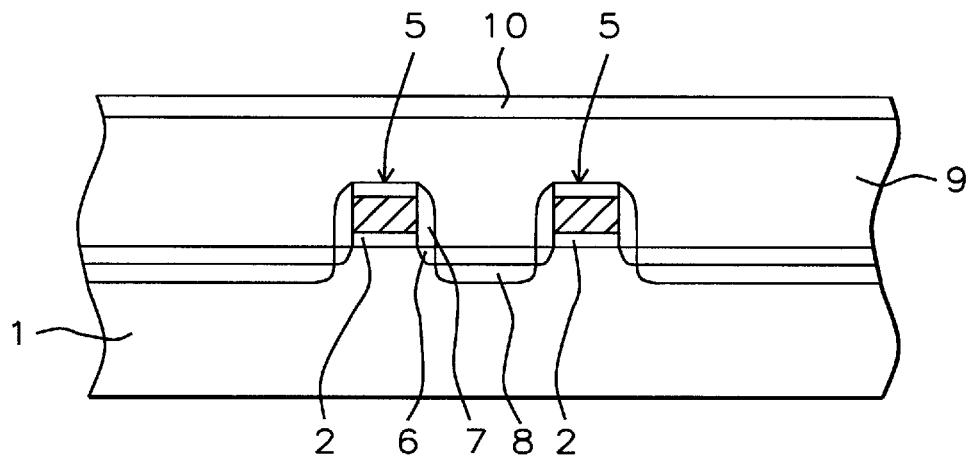

FIG. 1, schematically shows the creation of the transfer gate transistors, used for the DRAM cell. A semiconductor substrate 1, comprised of P type, single crystalline silicon, having a <100>, crystallographic orientation, is used. A gate insulator 2, comprised of silicon dioxide, obtained via thermal oxidation procedures, to a thickness between about 50 to 200 Angstroms, is next grown. A polysilicon layer is next deposited using low pressure chemical vapor deposition, (LPCVD), to a thickness between about 1500 to 4000 Angstroms. The polysilicon layer can be grown using in situ doping procedures, or grown intrinsically and doped via ion implantation procedures. If desired polysilicon layer 3, can be replaced by a polycide, (metal silicide on polysilicon), layer. This can be accomplished via an LPCVD procedure, used to deposit a thin polysilicon layer, followed by the deposition of an overlying metal silicide layer, such as tungsten silicide. Polycide layers offer lower resistance than polysilicon counterparts, thus resulting in performance enhancements. An insulator layer 4, comprised of silicon oxide, or silicon nitride, is next deposited via LPCVD, or plasma enhanced chemical vapor deposition, (PECVD), procedures, at a thickness between about 500 to 2000 Angstroms. Conventional photolithographic and anisotropic RIE procedures, using $CHF_3$ as an etchant for insulator layer 4, and using $Cl_2$ as an etchant for polysilicon layer 3, are used to create gate structures 5, shown schematically in FIG. 1. The photoresist shape, used as a mask for gate structure patterning, is removed using plasma oxygen ashing and careful wet cleans Lightly doped, N type source/drain regions 6, are next created via ion implantation of arsenic or phosphorous, at an energy between about 15 to 35 KeV, at a dose between about 1E14 to 1E15 atoms/cm$^2$. Insulator spacers 7, are formed by initially depositing a layer of silicon oxide, using LPCVD or PECVD procedures, to a thickness between about 1000 to 3000 Angstroms, followed by an anisotropic RIE procedure, using $CHF_3$ as an etchant. Insulator spacers 7, can also be comprised of silicon nitride. Heavily doped, N type source and drain regions 8, shown schematically in FIG. 2, are next formed via ion implantation of either arsenic or phosphorous, at an energy between about 30 to 50 KeV, at a dose between about 1E15 to 1E16 atoms/cm$^2$. An interlevel polyoxide, (IPO), layer 9, comprised of silicon oxide is next deposited, via LPCVD or PECVD procedures, to a thickness between about 5000 to 8000 Angstroms. A planarization procedure, performed using chemical mechanical polishing, is employed to create a smooth top surface topography for IPO layer 9. A first silicon nitride layer 10, shown schematically in FIG. 2, is then deposited, via LPCVD or PECVD procedures, to a thickness between about 200 to 700 Angstroms.

Figure 3:
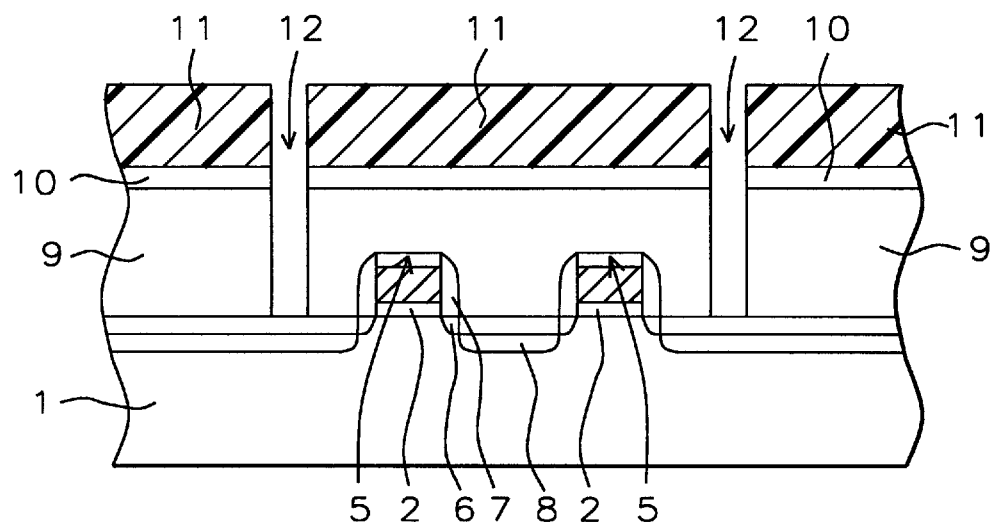
Figure 4:
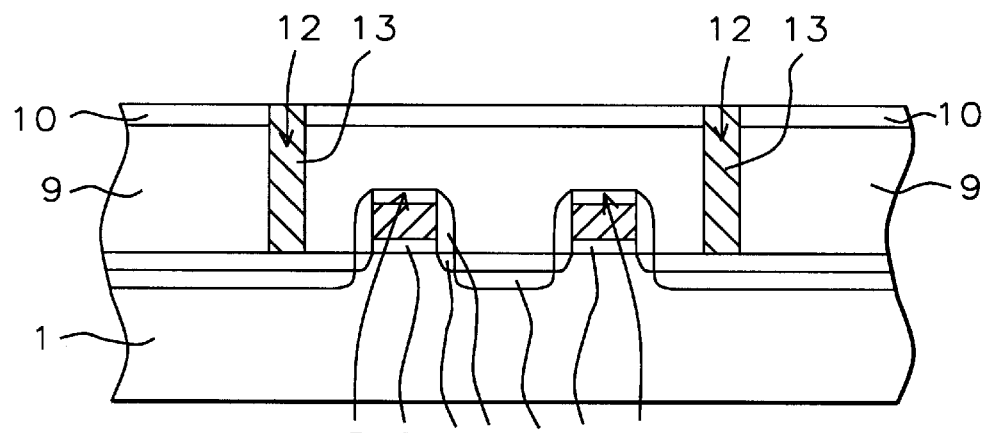
Figure 5:
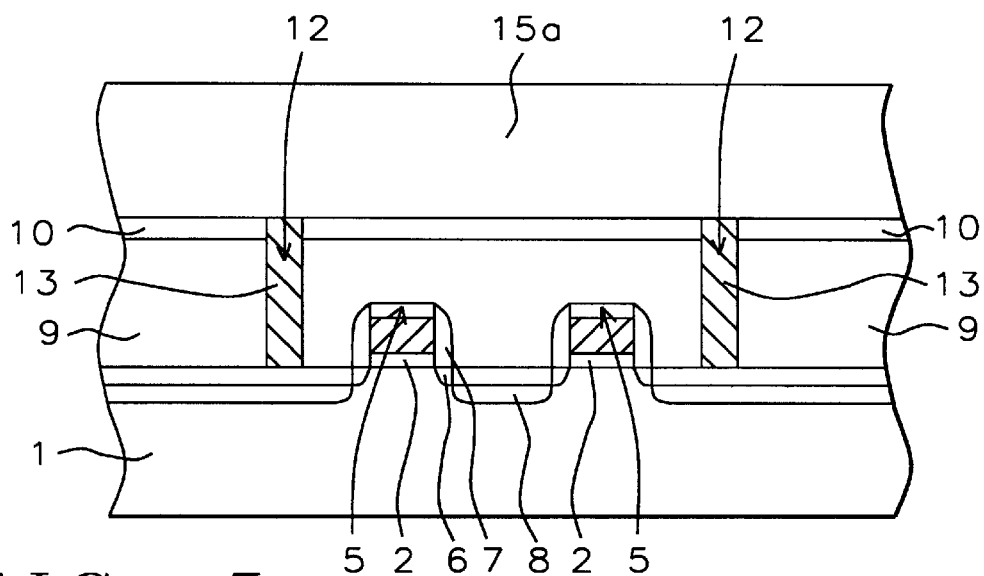

The creation of polysilicon plug structures are next addressed, and described using FIGS. 3–4. Photolithographic and RIE procedures, using $CF_4$–$SF_6$ as an etchant for first silicon nitride layer 10, and using $CHF_3$ as an etchant for IPO layer 9, are employed to open storage node contact holes 12, using photoresist shape 11, as an etch mask. Each storage node contact hole 12, shown schematically in FIG. 3, exposes the top surface of a heavily doped, N type source/drain region 8. After removal of photoresist shape 11, via plasma oxygen ashing and careful wet cleans, a first polysilicon layer is deposited using LPCVD procedures, to a thickness between about 1800 to 3000 Angstroms, completely filling storage node contact holes 12. The first polysilicon layer can be deposited using in situ doping procedures, via the addition of either phosphine or arsine, to a silane source. The first polysilicon layer can also be deposited intrinsically, and doped via ion implantation procedures, using either arsenic or phosphorous. Removal of the first polysilicon layer, from the top surface of first silicon nitride layer 10, via an anisotropic RIE procedure, using $Cl_2$ as an etchant, or via a chemical mechanical polishing procedure, results in the formation of polysilicon plugs 13, located in each of storage node contact holes 12, each contacting a heavily doped, N type source/drain region 8. This is schematically shown in FIG. 4.

Figure 6A:
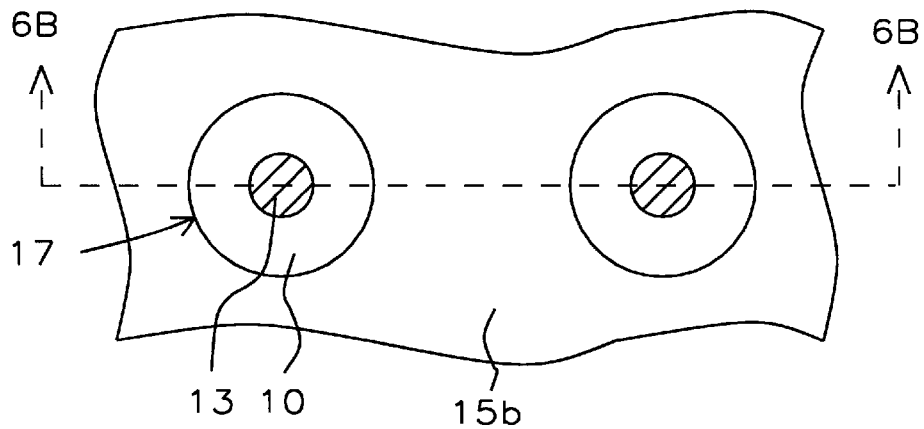
FIGS. 6A, 8A, and 14A, which schematically show the top view of the DRAM STC structure, at key fabrication stages.
Figure 6B:
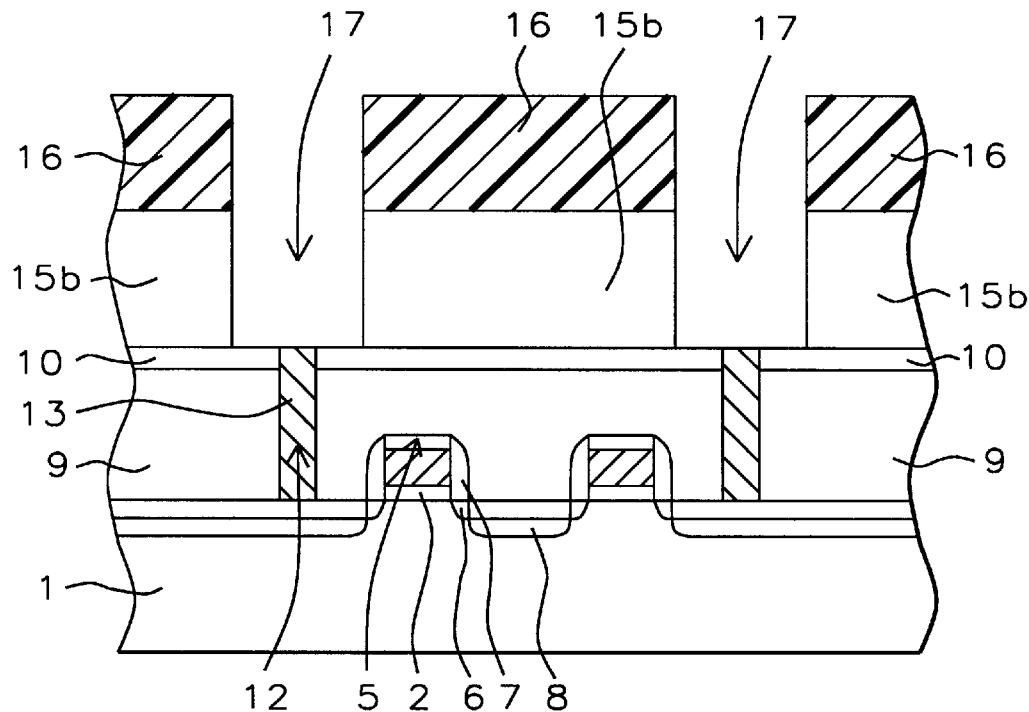
Figure 7:
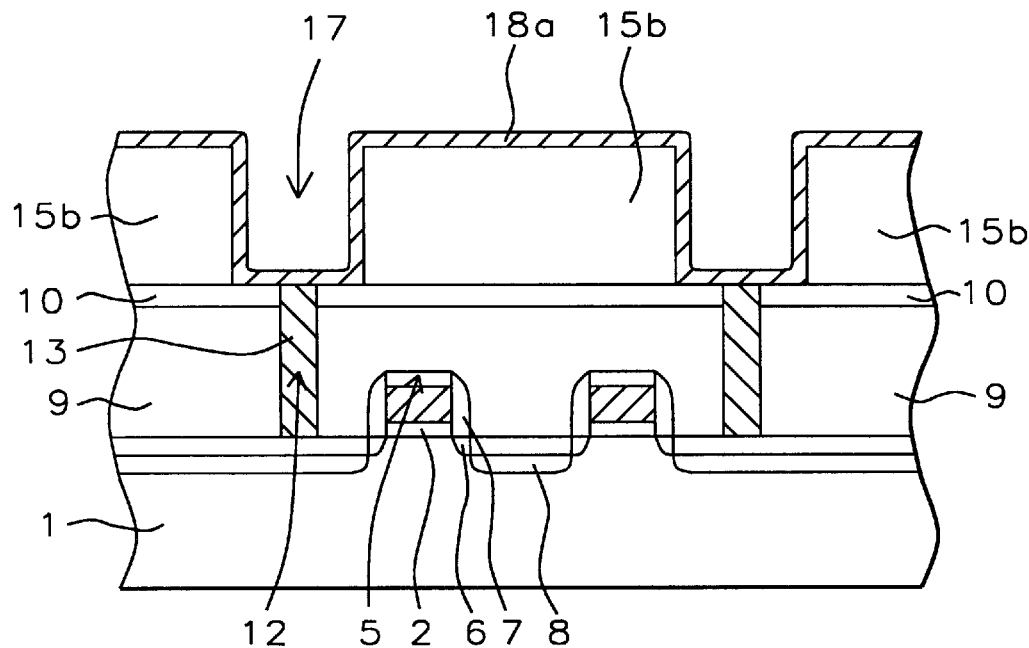
Figure 8A:
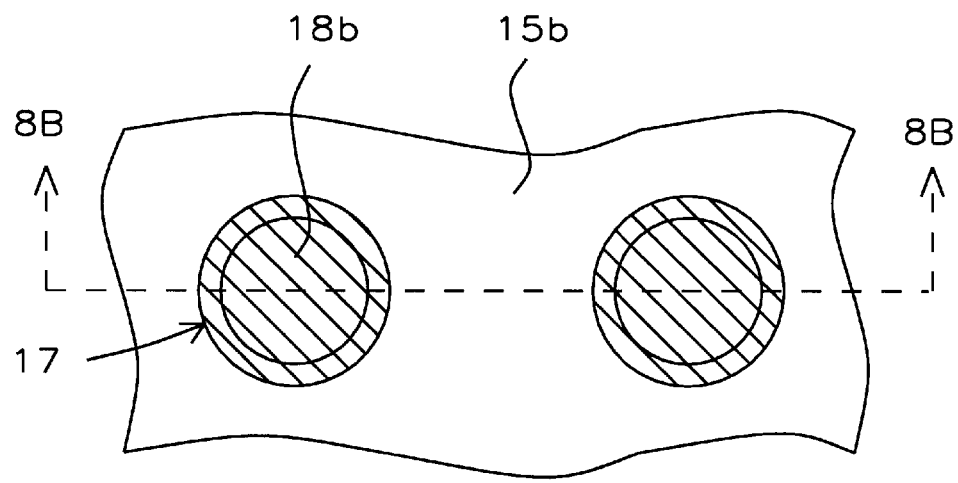
Figure 8B:
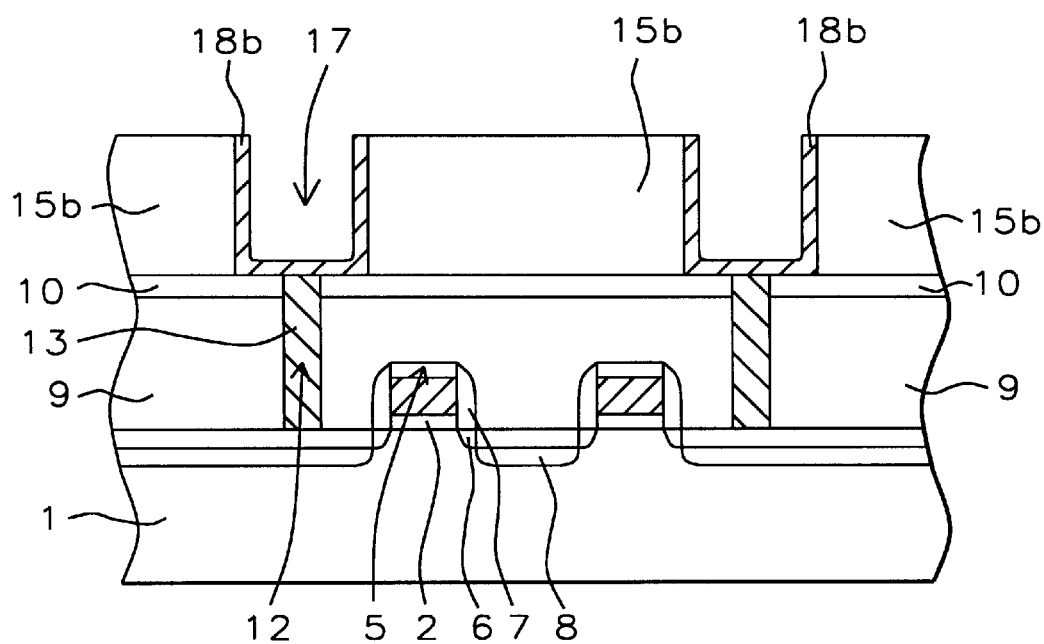
Figure 9:
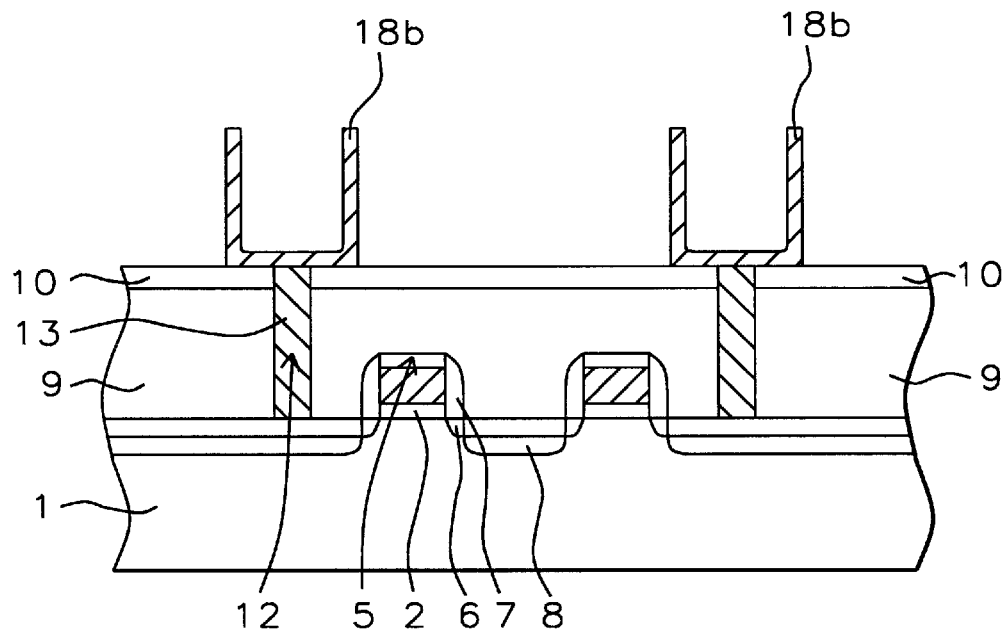

The formation of the cylindrical shaped, storage node structure, is next addressed, and described in FIGS. 5–9, and in FIGS. 6A and 8A. A insulator layer, 15a, shown schematically in FIG. 5, comprised of silicon oxide, is deposited using LPCVD or PECVD procedures, to a thickness between about 5000 to 15000 Angstroms, using tetraethylorthosilicate, (TEOS), as a source. Photoresist shape 16, is next formed on underlying insulator layer 15a, and used as a mask, to allow an anisotropic RIE procedure, using $CHF_3$ as an etchant, to create openings 17, in insulator layer 15a. The anisotropic RIE procedure, applied to blanket insulator layer 15a, results in the creation of insulator shapes 15b, in addition to openings 17, schematically shown in cross-sectional style in FIG. 6B, and schematically shown for the top view in FIG. 6A. After removal of photoresist shape 16, via plasma oxygen ashing and careful wet cleans, second polysilicon layer 18a, is deposited, via LPCVD procedures, to a thickness between about 1000 to 3000 Angstroms. Second polysilicon layer 18a, shown schematically in FIG. 7, is in situ doped, during deposition, via the addition of arsine, or phosphine, to a silane ambient. The continuous layer of second polysilicon layer 18a, features deposition on the sides of insulator shapes 15b.

A chemical mechanical polishing procedure is next used to remove second polysilicon layer 18a, only from the top surface of insulator shapes 15b, creating a cylindrical shaped, polysilicon storage node structure 18b, in each opening 17, located between insulator shapes 15b. Each cylindrical shaped, polysilicon storage node structure 18b, located in each opening 17, is comprised of vertical polysilicon features, located on the sides of insulator shapes 15b, and is also comprised of a horizontal polysilicon feature, overlying first silicon nitride layer 10, and contacting polysilicon plug 13, located in storage node contact hole 12. This is schematically shown in cross-sectional form in FIG. 8B, while the top view of the structure, is shown schematically in FIG. 8A. A wet etch procedure, using a buffered hydrofluoric acid solution, is next used to completely remove insulator shapes 15b, resulting in the two, cylindrical shaped, polysilicon storage node structures 18b, schematically shown in FIG. 9. Second silicon nitride layer 10, was used as the etch stop during the buffered hydrofluoric acid removal of insulator shapes 15b, protecting underlying materials, such as IPO layer 9.

Figure 10:
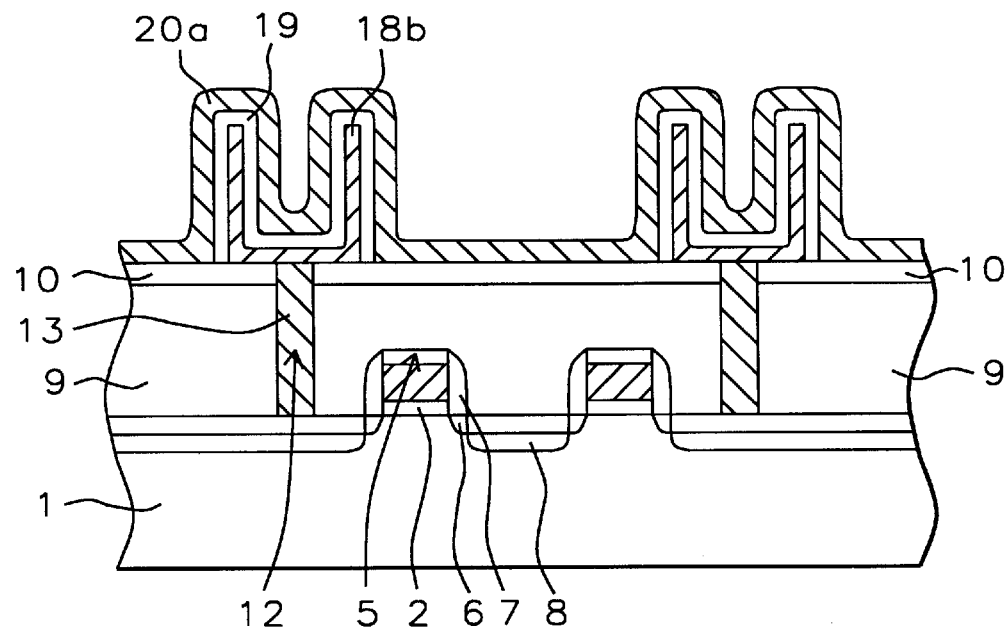

A capacitor dielectric layer 19 is next formed on the top surface of the cylindrical shaped, polysilicon storage nodes structures 18b. Capacitor dielectric layer 19, is a composite dielectric layer of silicon oxynitride - silicon nitride - silicon oxide, (ONO), at an equivalent silicon oxide thickness of between about 40 to 80 Angstroms. The ONO layer is created by initially creating a native, silicon oxide layer, between about 10 to 30 Angstroms in thickness, on the surface of the cylindrical shaped, polysilicon storage node structures 18b. A thin layer of silicon nitride is next deposited, using LPCVD procedures, to a thickness between about 30 to 50 Angstroms. An oxidation procedure, performed in an oxygen—steam ambient, is next used to convert the surface of the silicon nitride layer, to a silicon oxynitride layer, thus creating the ONO layer, overlying cylindrical shaped, polysilicon storage node structures 18b. After creation of capacitor dielectric layer 19, a third polysilicon layer 20a, is deposited, via LPCVD procedures, to a thickness between about 500 to 2000 Angstroms. Third polysilicon layer 20a, can be in situ doped, during deposition, via the addition of arsine, or phosphine, to a silane ambient, or third polysilicon layer 20a, can be grown intrinsically and doped via ion implantation procedures, using arsenic or phosphorous. Third polysilicon layer 20a, schematically shown in FIG. 10, overlays the cylindrical shaped, polysilicon storage node structures 18b, and also overlays first silicon nitride layer 10, located in the space between cylindrical shaped, polysilicon storage node structures 18b.

Figure 11:
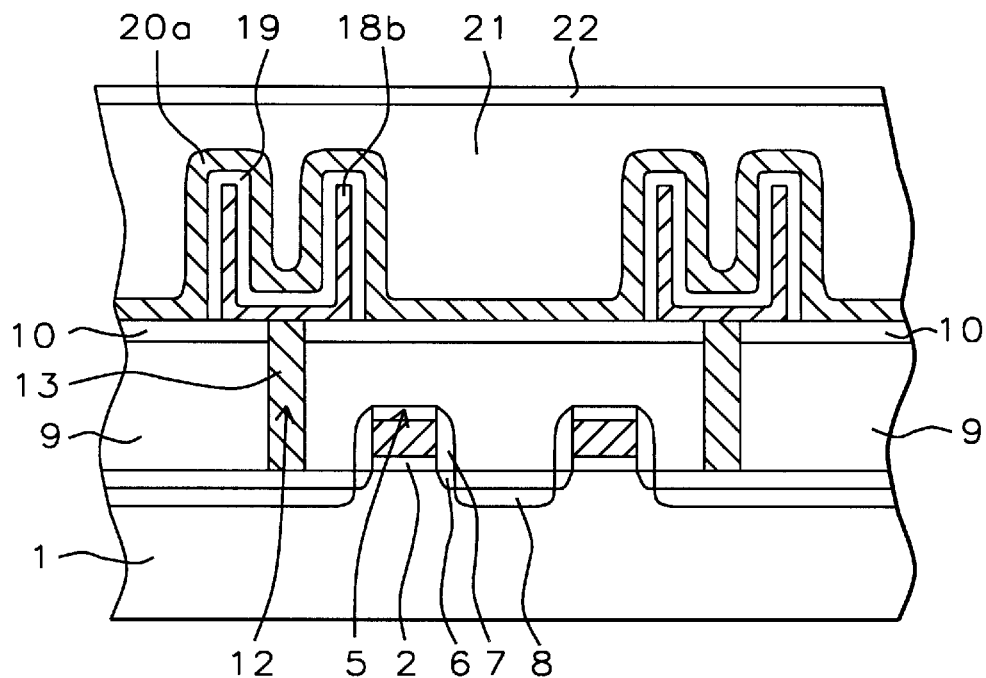

Unlike conventional procedures, used for definition of polysilicon cell plate structures, realized via the direct patterning of third polysilicon layer 20a, the definition of the subsequent polysilicon cell plate structure, used with this invention, is postponed to a later stage of processing. The difficulty with the use of conventional photolithographic and anisotropic RIE procedures, used for patterning of third polysilicon layer 20a, and complicated by the severe topography presented by the underlying cylindrical shaped, polysilicon storage node structures, resulted in the novel process sequence, used in this invention and described schematically in FIGS. 11–13, 14A, 14B, and 15. First an interlevel dielectric, (ILD), layer 21, is deposited using LPCVD or PECVD procedures, to a thickness between about 10000 to 20000 Angstroms. ILD layer 21, can be a silicon oxide layer, deposited using TEOS as a source, or ILD layer 21, can be a boro-phosphosilicate glass, (BPSG), layer, formed using TEOS as a source, and with the addition of diborane and phosphine. Planarization of ILD layer 21, is accomplished via use of either a reflow procedure, performed at a temperature between about 650 to 850° C., or via a chemical mechanical polishing procedure, with both options resulting in a smooth top surface topography for ILD layer 21. A second silicon nitride layer 22, is next deposited on underlying ILD layer 21, via LPCVD or PECVD procedures, to a thickness between about 500 to 2000 Angstroms. The result of these depositions is schematically shown in FIG. 11.

Figure 12:
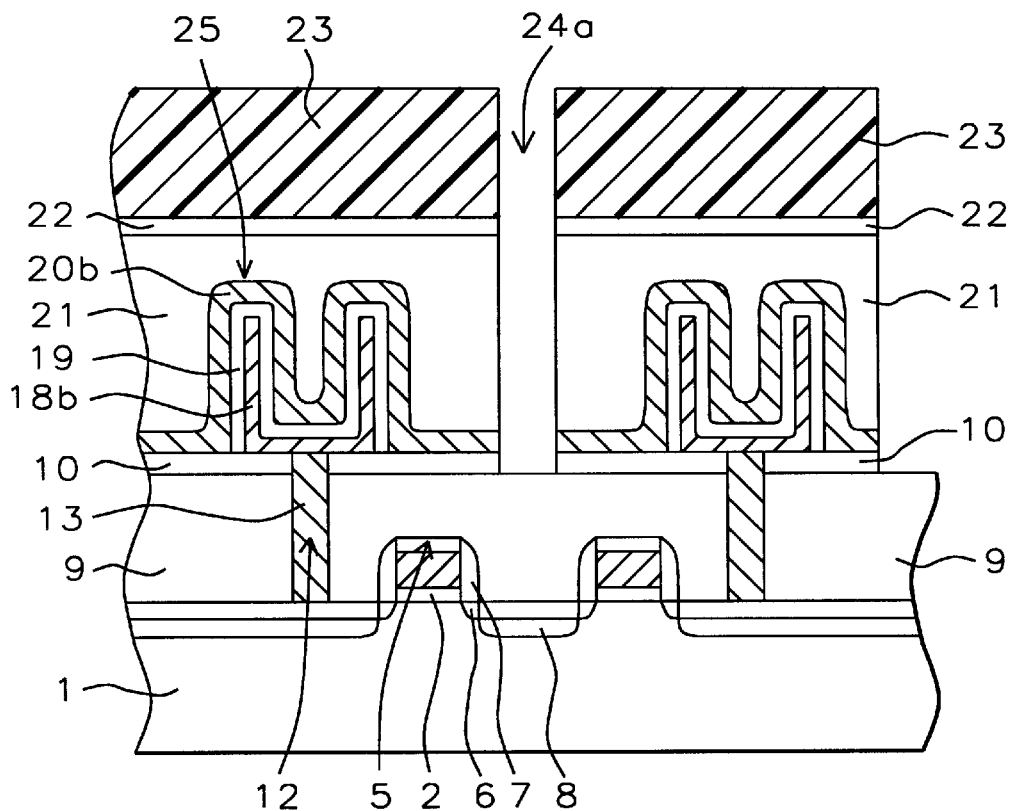
Figure 13:
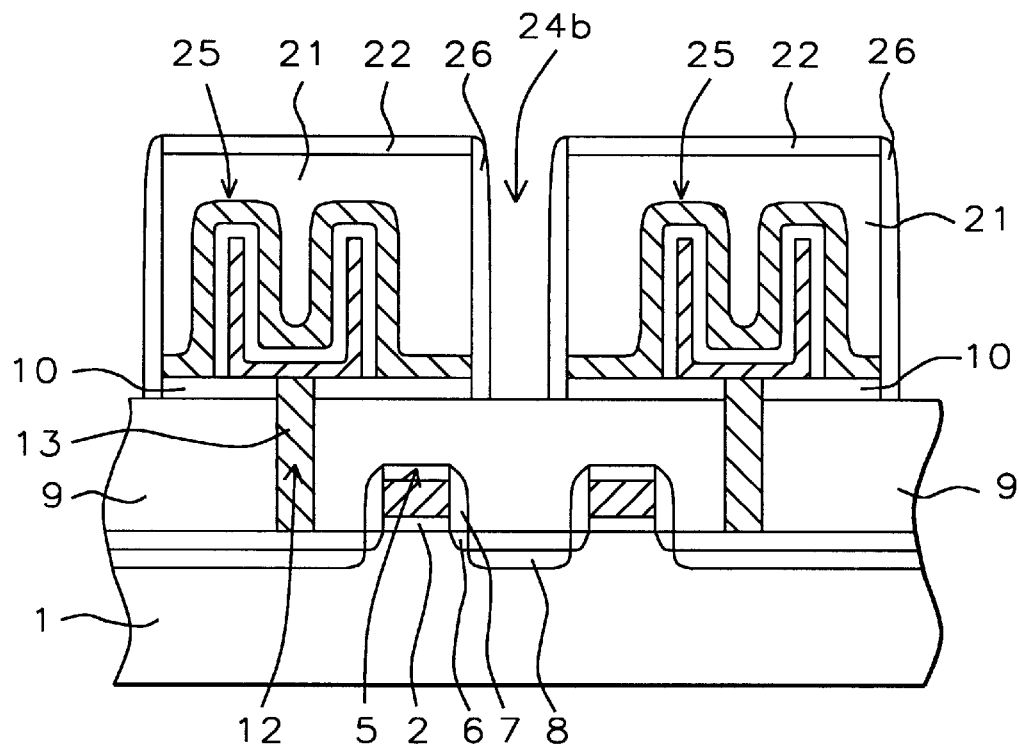
Figure 14A:
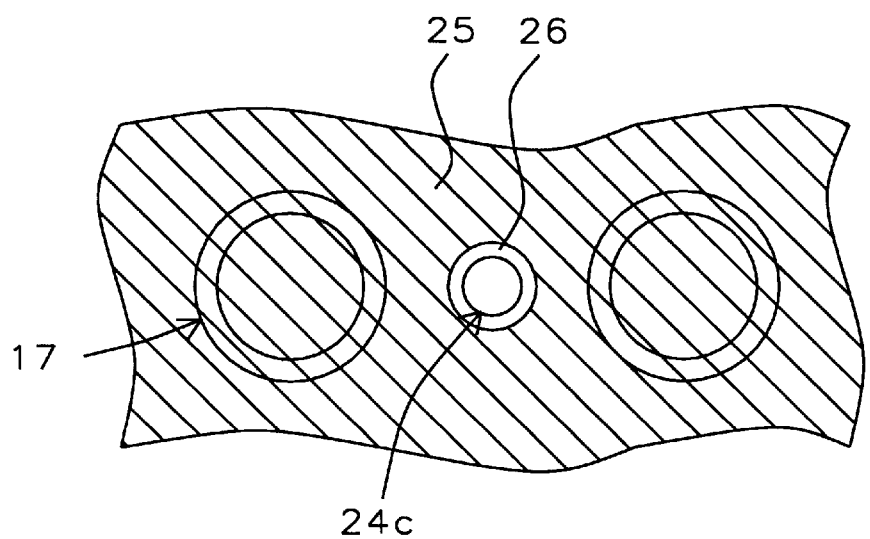
Figure 14B:
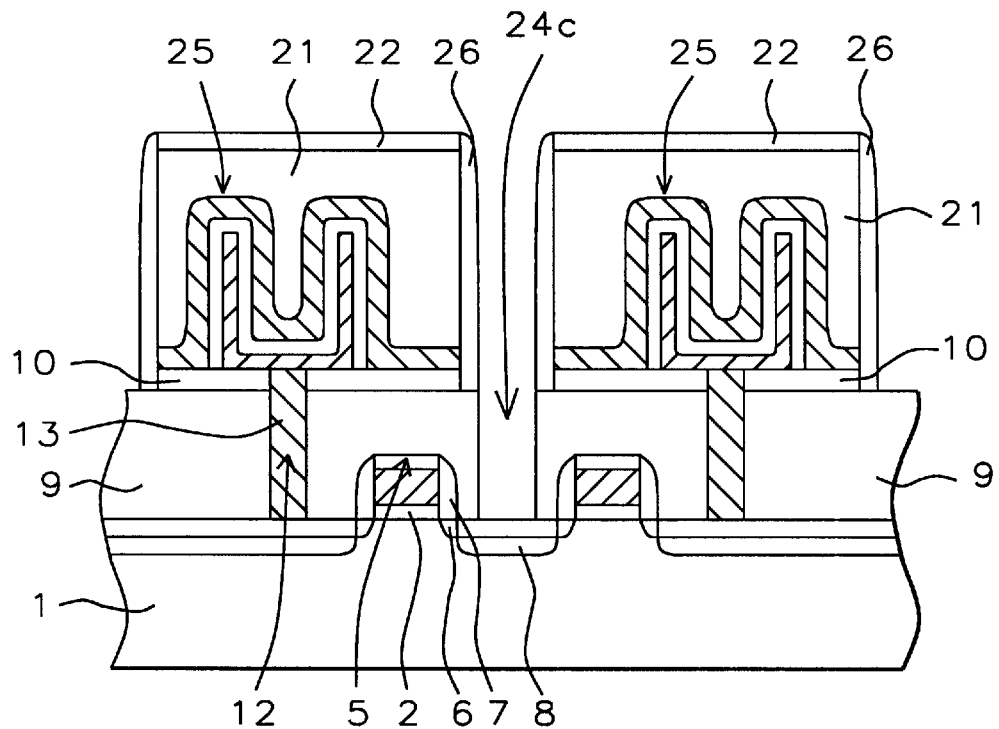

The critical procedure, for opening a top portion of the bit line contact hole, and for the definition of the polysilicon cell plate structure, is now addressed. A photoresist shape 23, is formed on second silicon nitride layer 22, and followed by a selective anisotropic RIE procedures, using $CF_4$–$SF_6$ as an etchant for second silicon nitride layer 22, using $CHF_3$ as an etchant for ILD layer 21, using $Cl_2$ as an etchant for third polysilicon layer 20a, and using $CF_4$–$SF_6$ as an etchant for first silicon nitride layer 10. These anisotropic RIE procedures result in the formation of a top portion of bit line contact hole 24a, and also result in the definition of polysilicon cell plate structure 20b, created via the patterning of third polysilicon layer 20a. The result of these RIE procedures are schematically shown in FIG. 12. The use of these selective, anisotropic RIE procedures allow the formation of polysilicon cell plate structure 20b, to be realized without having to use conventional photolithographic and RIE procedures, applied to third polysilicon silicon layer 20a, at an earlier stage of the process, where the topography of the cylindrical shaped, polysilicon storage node structures 18b, may have adversely influenced the procedure. In addition the combination of defining the polysilicon cell plate structure, and opening a top portion of a bit line contact hole, reduces the number of fabrication steps. The etch selectivity between silicon nitride and silicon oxide, using $CF_4$–$SF_6$ as an etchant, allowed this etching procedure to terminate on IPO layer 9. This process sequence also resulted in the completion of cylindrical shaped, stacked capacitor structure 25, shown schematically in FIG. 12, comprised of polysilicon cell plate structure 20b, capacitor dielectric layer 19, and underlying, cylindrical shaped, polysilicon storage node structures 18b.

Figure 15:
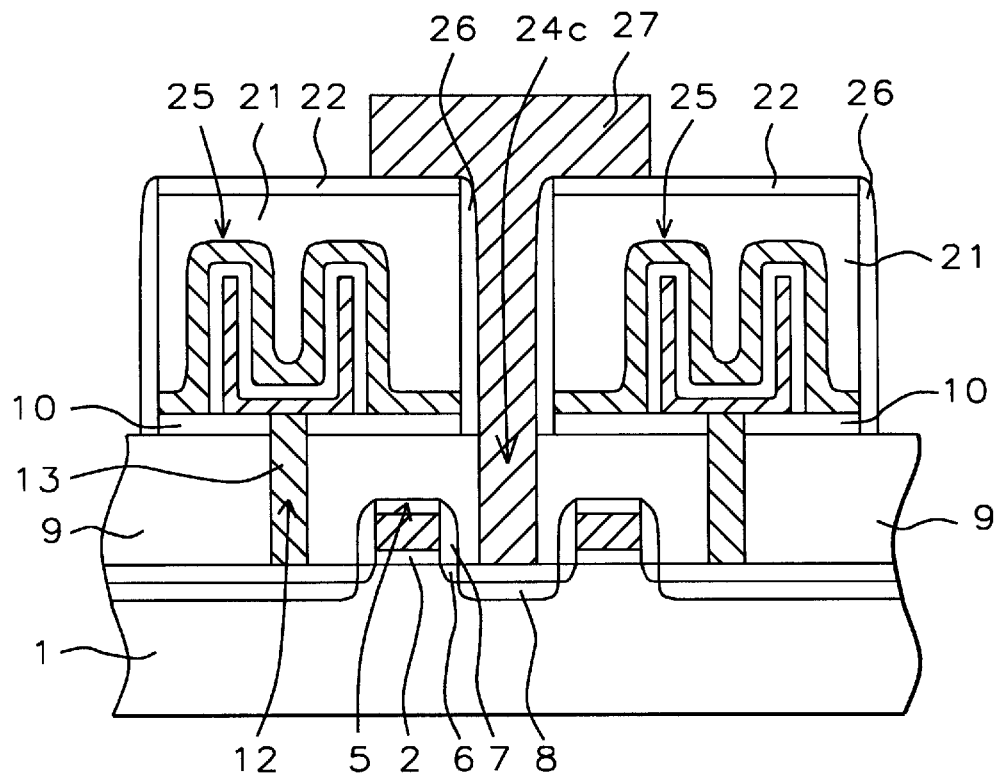

After removal of photoresist shape 23, performed using plasma oxygen ashing and careful wet cleans, a third silicon nitride layer 26, is deposited using LPCVD or PECVD procedures, to a thickness between about 200 to 500 Angstroms. An anisotropic RIE procedure, using $CF_4$–$SF_6$ as an etchant, is used to remove third silicon nitride layer 26, from the top surface of second silicon nitride layer 22, and from the surface of IPO layer 9, located in the bottom of the top portion of bit line contact hole 24a, creating silicon nitride spacers 26, on the sides of the narrower, top portion of bit line contact hole 24b, schematically shown in FIG. 13. Another selective, anisotropic RIE procedure, using $CHF_3$ as an etchant for IPO layer 9, is used complete to the opening of bit line contact hole opening 24c, exposing heavily doped, N type source/drain region 8, located between gate structures 5. This is shown in cross sectional style, schematically in FIG. 14B, while the top view is shown schematically in FIG. 14A. This procedure was accomplished without the use of photoresist masking, using second silicon nitride layer 22 and the silicon nitride spacers 26, as an etch mask. This was realized as a result of the high etch rate ratio of IPO layer 9, to second silicon nitride layer 22, using $CHF_3$ as the RIE ambient. Bit line structure 27, is formed overlying second silicon nitride layer 22, and contacting heavily doped, N type source/drain region 8, in bit line contact hole 24c. Bit line structure 27, shown schematically in FIG. 15, is formed via deposition of a metal layer, such as tungsten, or such as a aluminum based layer. Conventional photolithographic and anisotropic RIE procedures, using $Cl_2$ as an etchant for the metal layer, is used to define bit line structure 27. Bit line structure 27, is separated from the cylindrical shaped, stacked capacitor structure 25, by silicon nitride spacers 26, located on the sides of the top portion of the bit line contact hole. The photoresist shape, used as a mask for definition of bit line structure 27, is once again removed using plasma oxygen ashing and careful wet cleans. Contact holes, and contact structures, to the cylindrical shaped, storage node structures 18b, of the cylindrical shaped, stacked capacitor 25, are not shown in the drawings, however these are accomplished by opening contact holes in second silicon nitride layer 22, and in ILD layer 21, exposing the top surface of polysilicon cell plate structures 20b. Metal deposition and patterning are than performed, creating the contact structures to the cylindrical shaped, stacked capacitor structures 25.

While this invention has been particularly shown and described with reference to the preferred embodiments thereof, it will be understood by those skilled in the art that various changes in form and details may be made without departing from the spirit and scope of the invention.

What is claimed is:

1. A method for fabricating a cylindrical shaped, stacked capacitor structure, for a DRAM device on a semiconductor substrate, wherein a top portion of a bit line contact hole, and a polysilicon cell plate structure, are both defined during the same photolithographic and anisotropic etching procedure, while a bottom portion of said bit contact opening is selectively opened using silicon nitride as an etch mask, comprising the steps of:

providing two gate structures, on an underlying gate insulator layer, with source/drain region at the sides of, and between, the two gate structures;

forming a planarized first composite insulator layer, comprised of an underlying, planarized, first silicon oxide layer, and an overlying first silicon nitride layer;

forming storage node contact holes, in said planarized, first composite insulator layer, with each storage node contact hole, exposing a source/drain region, located at the side of the two gate structure;

forming polysilicon plug structures, in said storage node contact holes;

depositing a masking insulator layer;

opening two holes in said masking insulator layer, with each hole exposing the top surface of a polysilicon plug structure, and exposing a portion of the top surface of said first silicon nitride layer;

depositing a first polysilicon layer;

removal of said first polysilicon layer from the top surface of said masking insulator layer, resulting in the formation of a polysilicon, cylindrical shaped storage node structure, in each hole, with said polysilicon, cylindrical shaped storage node structure, comprised of vertical polysil.icon shapes, on the sides of each hole, and comprised of a horizontal polysilicon shape, in the bottom of each hole, connected to said vertical polysilicon shapes, and with said horizontal polysilicon shape, overlying and contacting a polysilicon plug structure;

removing said masking insulator layer;

forming a capacitor dielectric layer, on each said polysilicon, cylindrical shaped storage node structure;

depositing a second polysilicon layer;

forming a planarized second composite insulator layer, comprised of an underlying planarized, second silicon oxide layer, and comprised of an overlying, second silicon nitride layer;

using a photolithographic and anisotropic dry etching procedure to open said top portion of a bit line contact hole, in said planarized, second composite insulator layer, in said second polysilicon layer, and in said first silicon nitride layer, with said top portion of a bit line contact hole exposing said planarized, first silicon oxide layer, in a region in which said planarized, first silicon oxide layer overlays a source/drain region that is located between said gate structures, and forming said polysilicon cell plate structure;

depositing a third silicon nitride layer;

anisotropic dry etching of said third silicon nitride layer, to form silicon nitride spacers on the sides of said top portion of a bit line contact hole;

selectively defining bottom portion of said bit line contact hole, in said planarized, first silicon oxide layer, via an anisotropic dry etching procedure, using said second silicon nitride as an etch mask, exposing said source/drain region; and forming a bit line contact structure, overlying said second silicon nitride Layer, and completely filling said bit line contact hole, contacting said source/drain region, located between said gate structures.

2. The method of claim 1, wherein said first silicon nitride layer is deposited via LPCVD or PECVD procedures, to a thickness between about 200 to 700 Angstroms, and wherein said first silicon oxide layer is deposited using LPCVD or PECVD procedures, to a thickness between about 5000 to 8000 Angstroms.

3. The method of claim 1, wherein said polysilicon plug structures are formed from a polysilicon layer, deposited using an LPCVD procedure, at a thickness between about 1000 to 3000 Angstroms, and doped in situ, during deposition, via the addition of arsine or phosphine, to a silane ambient.

4. The method of claim 1, wherein said masking insulator layer is comprised of silicon oxide, deposited using LPCVD or PECVD procedures, to a thickness between about 5000 to 15000 Angstroms.

5. The method of claim 1, wherein said first polysilicon layer is deposited using LPCVD procedures, to a thickness between about 1000 to 3000 Angstroms, in situ doped during deposition, via the addition of arsine, or phosphine, to a silane ambient.

6. The method of claim 1, wherein said polysilicon, cylindrical shaped, storage node structures, are formed via the removal of said first polysilicon layer, from the top surface of said masking insulator layer, via a chemical mechanical polishing procedure.

7. The method of claim 1, wherein said masking insulator layer is removed using a buffered hydrofluoric acid solution.

8. The method of claim 1, wherein said capacitor dielectric layer is a silicon oxynitride—silicon nitride—silicon oxide, (ONO), layer, at an equivalent silicon oxide thickness between about 40 to 80 Angstroms, created by an initial thermal oxidation to form a silicon oxide layer, between about 1.0 to 30 Angstroms, followed by a deposition of silicon nitride, to a thickness between 30 to 50 Angstroms, and thermal oxidation of said silicon nitride layer, creating a silicon oxynitride layer on the underlying said silicon oxide layer.

9. The method of claim 1, wherein said second polysilicon layer is deposited using LPCVD procedures, to a thickness between about 500 to 2000 Angstroms, and doped in situ, during deposition, via the addition of either arsine, or phosphine, to the silane source, or wherein said second polysilicon layer is deposited intrinsically, and doped via ion implantation of either arsenic or phosphorous ions.

10. The method of claim 1, wherein said planarized, second composite insulator layer is comprised of an underlying, said planarized, second silicon oxide layer, via LPCVD or PECVD procedures, to a thickness between about 10000 to 20000 Angstroms, and comprised of an overlying, said second silicon nitride layer, deposited using LPCVD or PECVD procedures, to a thickness between about 500 to 2000 Angstroms.

11. The method of claim 1, wherein said top portion of a bit line contact hole is formed via anisotropic RIE procedures, using $CF_4$–$SF_6$ as an etchant for said second silicon nitride layer, using $CHF_3$ as an etchant for said second silicon oxide layer, using $Cl_2$ as an etchant for said second polysilicon layer, and using $CF_4$–$SF_6$ as an etchant for said first silicon nitride layer.

12. The method of claim 1, wherein said silicon nitride spacers, are between about 200 to 500 Angstroms in thickness, formed via deposition of said third silicon nitride layer, using LPCVD or PECVD procedures, followed by an anisotropic RIE procedure, using $CF_4$–$SF_6$ as an etchant for said third silicon nitride layer.

13. The method of claim 1, wherein said bottom portion of said bit line contact hole, is formed in said planarized, first silicon oxide layer, via selective anisotropic RIE procedure, using $CHF_3$ as an etchant.

* * * * *